United States Patent
Tanaka et al.

(10) Patent No.: US 10,121,955 B2
(45) Date of Patent: Nov. 6, 2018

(54) SUPERCONDUCTING MAGNET, MRI, AND NMR

(71) Applicant: HITACHI, LTD., Tokyo (JP)

(72) Inventors: Hideki Tanaka, Tokyo (JP); Tsuyoshi Wakuda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 388 days.

(21) Appl. No.: 15/100,702

(22) PCT Filed: Dec. 20, 2013

(86) PCT No.: PCT/JP2013/084184
§ 371 (c)(1),
(2) Date: Jun. 1, 2016

(87) PCT Pub. No.: WO2015/092910
PCT Pub. Date: Jun. 25, 2015

(65) Prior Publication Data
US 2016/0308110 A1 Oct. 20, 2016

(51) Int. Cl.
*H01L 39/10* (2006.01)
*G01R 33/3815* (2006.01)
*H01L 39/02* (2006.01)
(Continued)

(52) U.S. Cl.
CPC .......... *H01L 39/10* (2013.01); *G01R 33/3815* (2013.01); *H01F 6/008* (2013.01);
(Continued)

(58) Field of Classification Search
CPC ..... G01R 33/3815; H01F 6/008; H01L 39/02; H01L 39/10; H01L 39/20; H02H 1/0007; H02H 7/001
See application file for complete search history.

(56) References Cited

U.S. PATENT DOCUMENTS

| 3,428,925 | A | * | 2/1969 | Bogner | .................... C25D 3/42 174/110 R |
| 4,079,192 | A | * | 3/1978 | Josse | ....................... H01B 7/30 174/113 R |

(Continued)

FOREIGN PATENT DOCUMENTS

| JP | 59-075685 A | 4/1984 |
| JP | 62-229610 A | 10/1987 |

(Continued)

OTHER PUBLICATIONS

The Extended European Search Report dated Jul. 24, 2017 for the EP Application No. 13899826.5.

*Primary Examiner* — Thienvu Tran
*Assistant Examiner* — Nicolas Bellido
(74) *Attorney, Agent, or Firm* — Volpe and Koenig, P.C.

(57) ABSTRACT

An object of the present invention is to provide a persistent current switch with high heating efficiency by simplifying the configuration of the persistent current switch and reducing the heat capacity. To achieve the object, a superconducting magnet in accordance with the present invention includes a superconducting coil, a persistent current switch, and one of an alternating-current power supply, a pulsed power supply, or a charge/discharge circuit. The one of the alternating-current power supply, the pulsed power supply, or the charge/discharge circuit is connected to a loop circuit of the superconducting coil and the persistent current switch such that it is in parallel with the persistent current switch.

10 Claims, 3 Drawing Sheets

(51) Int. Cl.
*H01L 39/00* (2006.01)
*H02H 1/00* (2006.01)
*H02H 7/00* (2006.01)
*H01L 39/20* (2006.01)
*H01F 6/00* (2006.01)

(52) U.S. Cl.
CPC .............. *H01L 39/02* (2013.01); *H01L 39/20* (2013.01); *H02H 1/0007* (2013.01); *H02H 7/001* (2013.01)

(56) References Cited

U.S. PATENT DOCUMENTS

| | | | | |
|---|---|---|---|---|
| 8,855,731 | B2 * | 10/2014 | Tanaka | H01F 6/008 |
| | | | | 505/211 |
| 2006/0250134 | A1 * | 11/2006 | Kakugawa | G01R 33/381 |
| | | | | 324/321 |
| 2008/0287303 | A1 * | 11/2008 | Kato | H01L 39/14 |
| | | | | 505/231 |
| 2009/0267716 | A1 * | 10/2009 | Tanaka | H01F 6/003 |
| | | | | 335/216 |
| 2013/0012392 | A1 | 1/2013 | Tanaka et al. | |
| 2013/0234815 | A1 * | 9/2013 | Milward | H01F 6/00 |
| | | | | 335/216 |
| 2016/0343491 | A1 * | 11/2016 | Miyazoe | G01R 33/3815 |

FOREIGN PATENT DOCUMENTS

| | | | |
|---|---|---|---|
| JP | 03-071606 | | 3/1991 |
| JP | 04-137571 | | 5/1992 |
| JP | 06-085335 | | 3/1994 |
| JP | 10-270234 | | 10/1998 |
| JP | 2003-092032 A | | 3/2003 |
| JP | 2003092032 A | * | 3/2003 |
| JP | 2003-142744 A | | 5/2003 |
| JP | 2008-124175 A | | 5/2008 |
| JP | 2008124175 A | * | 5/2008 |
| JP | 2013-016664 A | | 1/2013 |
| WO | 2012/099029 A1 | | 7/2012 |

* cited by examiner

SUPERCONDUCTING MAGNET, MRI, AND NMR

TECHNICAL FIELD

The present invention relates to a superconducting magnet, Magnetic Resonance Imaging (MRI), and Nuclear Magnetic Resonance (NMR).

BACKGROUND ART

When a strong, stable magnetic field is needed, such as in MRI or NMR, a superconducting closed circuit is formed using a superconducting coil and a persistent current switch, and a current that will hardly attenuate is passed through the closed circuit to obtain a desired magnetic field.

For a persistent current switch, a superconductor is used as a current path. Typically, ON/OFF of the persistent current switch is controlled with the superconductor heated with a heater. The superconductor has a resistance of zero (i.e., ON state) when cooled to a temperature of less than or equal to its critical temperature, but becomes a normal conductor and generates resistance therein (i.e., OFF state) when heated to a temperature of greater than or equal to the critical temperature.

When a superconducting magnet is excited, a persistent current switch is switched OFF to allow almost all portions of current supplied from an excitation power supply to pass through the superconducting magnet. In order to increase the switching speed of the persistent current switch or suppress the amount of evaporation of refrigerant during the switching time, the difference between the temperature of the persistent current switch in an ON state and the critical temperature is preferably small. Meanwhile, if the temperature of the persistent current switch in an ON state is set close to the critical temperature of the superconductor, the temperature of the superconductor becomes close to the critical temperature and the superconductor thus becomes likely to quench when an external disturbance is applied to the persistent current switch. Thus, the stability of the persistent current switch becomes low.

A low-temperature superconductor, such as NbTi, is typically cooled using liquid helium. Thus, the temperature of a persistent current switch, which uses a low-temperature superconductor, in an ON state is set to the liquid helium temperature (about 4 K), and the temperature thereof in an OFF state is around the critical temperature (about 9 K). In such a case, the temperature of the superconductor of the persistent current switch is increased by about 5 K through heating with a heater.

With the development of high-temperature superconductors in recent years, the critical temperatures of the superconductors have increased. For example, when a persistent current switch that uses a high-temperature superconductor with a critical temperature of 90 K is used in liquid helium, the temperature of the persistent current switch needs to be increased from 4K to 90 K. Such a persistent current switch that uses a high-temperature superconductor requires, in comparison with a persistent current switch that uses a low-temperature superconductor, a greater temperature increase as well as specific heat of the switch constituent material that is higher by one digit or more. Thus, an efficient heating method is needed.

For example, Patent Literature 1 discloses a persistent current switch that uses a high-temperature superconducting film, and describes YBCO and the like as examples of a high-temperature superconductor.

CITATION LIST

Patent Literature

Patent Literature 1: JP 2003-142744 A

SUMMARY OF INVENTION

Technical Problem

However, the persistent current switch of Patent Literature 1 has a problem in that the heat capacity of the entire persistent current switch is high because an insulating substrate that has a sufficient thickness to maintain strength is provided between the superconducting film and a heater.

It is an object of the present invention to provide a persistent current switch with high heating efficiency by simplifying the configuration of the persistent current switch and reducing the heat capacity.

Solution to Problem

In order to achieve the aforementioned object, a superconducting magnet in accordance with the present invention includes a superconducting coil, a persistent current switch, and one of an alternating-current power supply, a pulsed power supply, or a charge/discharge circuit. The one of the alternating-current power supply, the pulsed power supply, or the charge/discharge circuit is connected to a loop circuit of the superconducting coil and the persistent current switch such that it is in parallel with the persistent current switch.

Advantageous Effects of Invention

According to the present invention, a persistent current switch can be switched ON or OFF with high heating efficiency.

DESCRIPTION OF EMBODIMENTS

Hereinafter, embodiments of the present invention will be described with reference to exemplary drawings.

Embodiment 1

Figure 1:
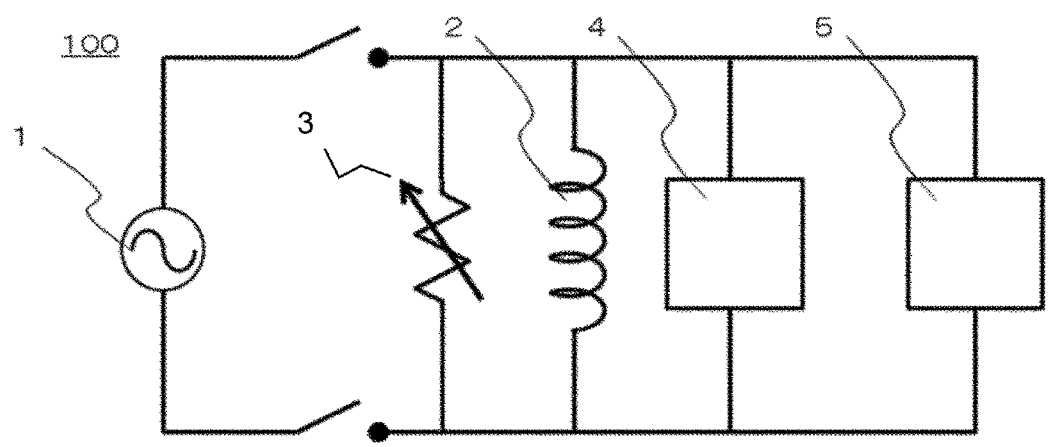
FIG. 1 illustrates a schematic configuration of a superconducting magnet in Embodiment 1.

FIG. 1 illustrates a schematic configuration of a superconducting magnet 100 that is common to each embodiment. A superconducting coil 2, a persistent current switch 3, a quench detector 4, and a protection circuit 5 are connected in parallel. The superconducting coil 2 is a coil produced by winding a superconducting wire, and is stored in a refrigerated container so as to be cooled to a temperature of less than or equal to the critical temperature of the superconducting wire using a refrigerant or a refrigerator. The persistent current switch 3 is also formed with a superconducting wire, but is formed in a non-inductive wound shape, for example, so as to have small inductance components, and the inductance components are suppressed to be only the internal inductance. The persistent current switch 3 is cooled to a temperature of less than the critical temperature in an ON state, and is heated to a temperature of greater than or equal to the critical temperature in an OFF state so that resistance is generated. The quench detector 4 is a device for detecting a quench signal that is generated when a part of the superconducting wire changes the normal conducting state. Upon detection of a quench signal, a control signal is sent to a power supply (not shown), the protection circuit 5, and the like so that a protection operation for the superconducting coil 2 is started. The protection circuit 5 is selected from among a protective resistor for attenuating current, a quench-back circuit with a heater that is thermally connected to the superconducting coil 2, and the like.

The conventional persistent current switch has a built-in heater wire to heat a superconducting wire in the switch, and is controlled to generate heat by passing current through the heater wire and thus heat the superconducting wire. In the present invention, an alternating-current power supply 1 is connected to the persistent current switch 3 so as to directly pass current through a superconducting wire 6 of the persistent current switch 3 and thus heat the superconducting wire 6. The persistent current switch 3 of the present invention is advantageous in that a heater wire is not needed and the structure can thus be simplified.

Although the quench detector 4 and the protection circuit 5 are described as separate members herein, the quench detector 4 may also be provided in the protection circuit 5.

Figure 2:
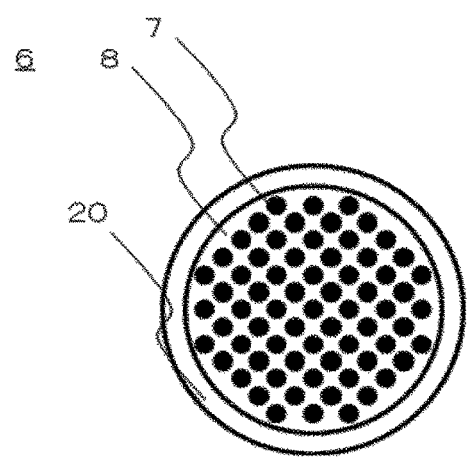
FIG. 2 is a cross-sectional schematic view of a superconducting magnetic wire in Embodiment 1.

FIG. 2 illustrates a cross-sectional schematic view of the superconducting wire 6 that constitutes the persistent current switch 3. The superconducting wire 6 includes a superconducting filament 7, a normal conducting portion 8, and a sheath 20. The inner periphery of the superconducting wire 6 is formed with the normal conducting portion 8, while the outer periphery of the superconducting wire 6 that covers the normal conducting portion 8 is formed with the sheath 20. The superconducting filament 7 is disposed such that it is surrounded by the normal conducting portion 8 in the inner periphery, and is not disposed in the sheath 20. Typically, an alternating current flows through the outer periphery of a wire in a concentrated manner due to the skin effect. Thus, a current can pass through the sheath 20 on the outer periphery of the superconducting wire 6 in a concentrated manner, so that Joule heat is generated and the superconducting wire 6 can thus be heated. The formula of the skin effect is represented by $d=\sqrt{(\rho/\pi F \mu)}$, where the skin depth is d, the frequency of an alternating current is f, the resistivity of a material that constitutes the sheath 20 is $\rho$, and the permeability of the sheath 20 is $\mu$. Accordingly, it is acceptable as long as the frequency of an alternating current is selected in accordance with a portion through which a current is to be passed. In order to efficiently pass a current through the sheath 20, it is acceptable as long as the relationship of $t/2<d$ is satisfied, where the thickness of the sheath 20 is t. Further, when the polarity of a current is made single, it is possible to relax the constraint conditions on the protection circuit 5, for example, the polarity of a diode.

Further, when an alternating current flows through the superconducting filament 7, heat called an alternating current loss is generated, and such heat is used to heat the superconducting wire 6. In addition, even when an alternating current passes through only the normal conducting portion 8, an alternating-current magnetic field is applied to the superconducting filament 7, and an alternating current loss is generated, which can also be used to heat the superconducting wire 6. Although FIG. 2 illustrates a circular wire with a circular cross-section, the present invention can also be applied to a square wire or a tape wire.

Figure 3:
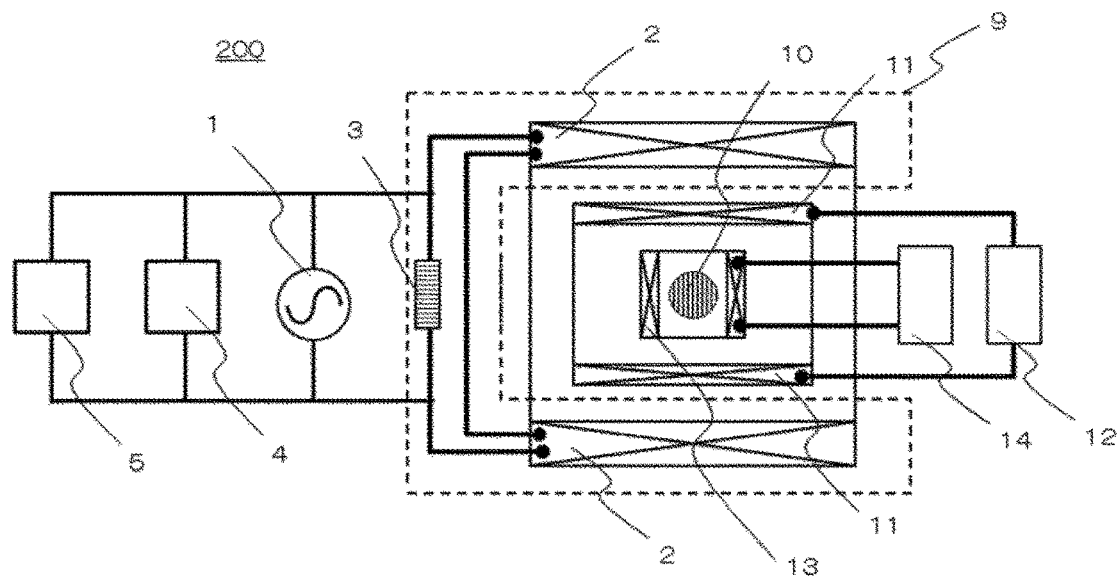
FIG. 3 illustrates a schematic configuration of MRI in Embodiment 1.

FIG. 3 illustrates a schematic configuration of MRI 200 using the present invention. The persistent current switch 3 is stored in a refrigerated container 9 together with the superconducting coil 2, and is cooled by a refrigerant or a refrigerator. A persistent current that flows through the persistent current switch 3 and the superconducting coil 2 generates a static magnetic field with high time stability at the position of a measurement target 10. As the static magnetic field is stronger, the nuclear magnetic resonance frequency becomes higher, and the intensity of a nuclear magnetic resonance signal also becomes higher. A gradient magnetic field coil 11 is supplied with a current that changes with time from a gradient magnetic field amplifier 12 as needed, and generates a magnetic field with a spatial distribution at the position of the measurement target 10. Further, a cross-sectional image of the measurement target 10 can be diagnosed by applying a magnetic field with a nuclear magnetic resonance frequency to the measurement target using an RF (Radio Frequency) antenna 13 and an RF transmitter/receiver 14 and measuring a response signal. It is also possible to realize NMR using the same configuration.

Embodiment 2

The following embodiment will describe only the difference from Embodiment 1.

Figure 4:
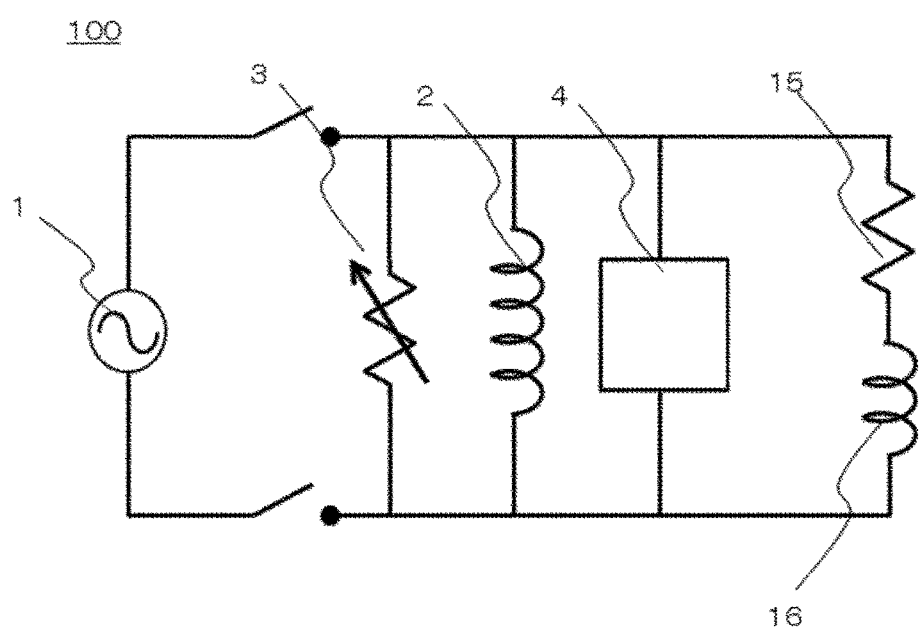
FIG. 4 illustrates a schematic configuration of a superconducting magnet in Embodiment 2.

FIG. 4 illustrates a schematic configuration of the superconducting magnet 100 when a series circuit of protection circuit resistance components 15 and protection circuit inductance components 16 is used as an example of the protection circuit 5 described in Embodiment 1. As the inductance of the persistent current switch 3 is not zero, if the protection circuit inductance components 16 are absent, an alternating current supplied from the alternating-current power supply 1 mainly flows through the protection circuit 5. Therefore, increasing the protection circuit inductance components 16 more than the inductance components of the persistent current switch 3 can increase the amount of an alternating current that flows through the persistent current switch 3 and thus increase the heating efficiency. It should be noted that when the protection circuit inductance components 16 are increased, the time constant for turning a direct current, which has been flowing through a superconducting loop of the superconducting coil 2 and the persistent current switch 3, to the protection circuit 5 becomes long. Thus, the protection circuit inductance components 16 should be designed to have an appropriate magnitude.

Embodiment 3

Figure 5:
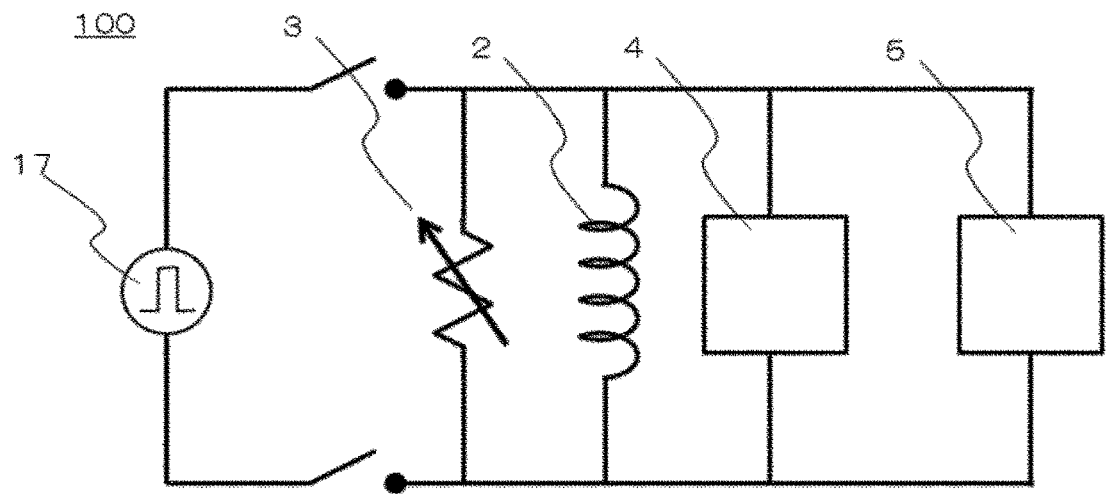
FIG. 5 illustrates a schematic configuration of a superconducting magnet in Embodiment 3.

FIG. 5 illustrates a schematic configuration of the superconducting magnet 100 when a pulsed power supply 17 is used instead of the alternating-current power supply 1 described in Embodiment 1. When a square-wave current is supplied using the pulsed power supply 17, it is possible to concentrate the current conduction range to the sheath 20 by setting the square wave such that it satisfies $t/2<\sqrt{(\rho/\pi F'\mu)}$, where the fundamental frequency when the square wave is expanded in the Fourier Series is f'.

Embodiment 4

Figure 6:
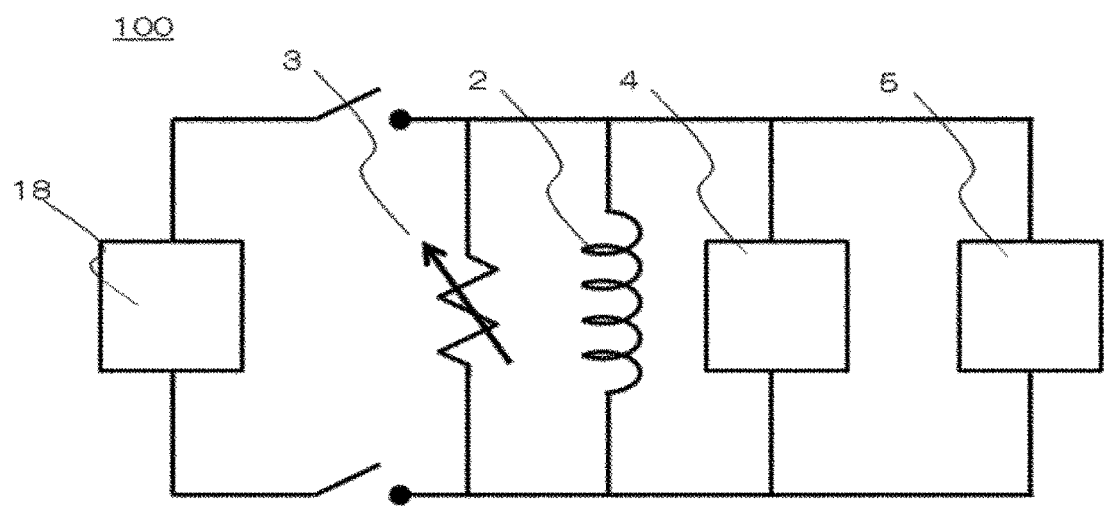
FIG. 6 illustrates a schematic configuration of a superconducting magnet in Embodiment 4.

FIG. 6 illustrates a schematic configuration of the superconducting magnet 100 that uses a charge/discharge circuit 18 instead of the alternating-current power supply 1 described in Embodiment 1. When energy accumulated in a capacitor is released to the persistent current switch 3, the persistent current switch 3 can be heated as with the pulsed power supply. If a plurality of capacitors is prepared and is sequentially discharged, it is possible to accumulate a desired amount of energy. Further, if the capacitors are arranged in the refrigerated container 9, it is possible to detach current leads for charging the capacitors from an external power supply after charging, and suppress entry of heat into the refrigerated container 9 by a corresponding amount. With respect to the waveform of a current supplied to the sheath 20 by discharging, if the current waveform is set such that it satisfies $t/2<\sqrt{(\rho/\pi F'\mu)}$, where the fundamental frequency when the current waveform is expanded in the Fourier Series is f', it is possible to concentrate the current conduction range to the sheath 20 as with the square-wave current shown in Embodiment 3.

REFERENCE SIGNS LIST

1 Alternating-current power supply
2 Superconducting coil
3 Persistent current switch
4 Quench detector
5 Protection circuit
6 Superconducting wire
7 Superconducting filament
8 Normal conducting portion
9 Refrigerated container
10 Measurement target
11 Gradient magnetic field coil
12 Gradient magnetic field amplifier
13 RF antenna
14 RF transmitter/receiver
15 Protection circuit resistance components
16 Protection circuit inductance components
17 Pulsed power supply
18 Charge/discharge circuit
19 Quench-back circuit
20 Sheath
100 Superconducting magnet
200 MRI or NMR

The invention claimed is:

1. A superconducting magnet comprising:
a superconducting coil;
a persistent current switch; and
an alternating-current power supply, wherein
the alternating-current power supply is connected to a loop circuit of the superconducting coil and the persistent current switch such that the alternating-current power supply is in parallel with the persistent current switch,
the persistent current switch includes a superconducting wire,
the superconducting wire has disposed on an inner periphery thereof a normal conducting portion and a superconducting filament, and has disposed on an outer periphery thereof a sheath, and
provided that a frequency of the alternating-current power supply is f, a thickness of the sheath is t, a resistivity of a material of the sheath is $\rho$, and a permeability of the sheath is $\mu$, $t/2<\sqrt{(\rho/\pi f\mu)}$.

2. The superconducting magnet according to claim 1, wherein an alternating current flows through the outer periphery of the superconducting wire in a concentrated manner.

3. The superconducting magnet according to claim 2, wherein a current passes through the sheath on the outer periphery of the superconducting wire in a concentrated manner, so that a Joule heat is generated and the superconducting wire is heated.

4. The superconducting magnet according to claim 1, further comprising a protection circuit, the protection circuit being connected in parallel with the loop circuit of the superconducting coil and the persistent current switch.

5. The superconducting magnet according to claim 4, wherein inductance of the protection circuit is higher than inductance of the persistent current switch.

6. The superconducting magnet according to claim 1, further comprising a quench detector, the quench detector being connected in parallel with the loop circuit of the superconducting coil and the persistent current switch.

7. A superconducting magnet comprising:
a superconducting coil;
a persistent current switch; and
one of a pulsed power supply or a charge/discharge circuit, wherein
the one of the pulsed power supply or the charge/discharge circuit is connected to a loop circuit of the superconducting coil and the persistent current switch such that the one of the pulsed power supply or the charge/discharge circuit is in parallel with the persistent current switch,
the persistent current switch includes a superconducting wire,
the superconducting wire has disposed on an inner periphery thereof a normal conducting portion and a superconducting filament, and has disposed on an outer periphery thereof a sheath, and
provided that a fundamental frequency of a waveform of a current supplied by one of the pulsed power supply or the charge/discharge circuit when expanded in a Fourier Series is f, a thickness of the sheath is t, a resistivity of a material of the sheath is $\rho$, and a permeability of the sheath is $\mu$, $t/2\sqrt{(\rho/\pi f\mu)}$.

8. The superconducting magnet according to claim 7, wherein a current from the one of the pulsed power supply or the charge/discharge circuit flows through the outer periphery of the superconducting wire in a concentrated manner.

9. The superconducting magnet according to claim 8, wherein a current passes through the sheath on the outer periphery of the superconducting wire in a concentrated manner, so that a Joule heat is generated and the superconducting wire is heated.

10. A Magnetic Resonance Imaging (MRI) or a Nuclear Magnetic Resonance (NMR) comprising the superconducting magnet according to claim 1.

* * * * *